(12) United States Patent
Ohno et al.

(10) Patent No.: US 8,203,150 B2
(45) Date of Patent: Jun. 19, 2012

(54) SILICON CARBIDE SEMICONDUCTOR SUBSTRATE AND METHOD OF MANUFACTURING THE SAME

(75) Inventors: Toshiyuki Ohno, Tachikawa (JP); Natsuki Yokoyama, Mitaka (JP); Hajime Goto, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 283 days.

(21) Appl. No.: 12/453,985

(22) Filed: May 28, 2009

(65) Prior Publication Data

US 2009/0302328 A1 Dec. 10, 2009

(30) Foreign Application Priority Data

Jun. 4, 2008 (JP) ................................ 2008-146711

(51) Int. Cl.
*H01L 29/24* (2006.01)
(52) U.S. Cl. .............. 257/77; 257/E29.104; 257/E21.09
(58) Field of Classification Search .................... 257/77, 257/E29.104, E21.09, 197, 198, 442, 629, 257/635
See application file for complete search history.

(56) References Cited

U.S. PATENT DOCUMENTS

| 6,734,461 B1 * | 5/2004 | Shiomi et al. .................... 257/77 |
| 2006/0289873 A1 * | 12/2006 | Rowland et al. ................ 257/77 |

FOREIGN PATENT DOCUMENTS

| JP | 2003-318388 | 4/2002 |
| JP | 2007-506289 | 9/2004 |
| WO | WO 2005/034208 A2 | 4/2005 |

OTHER PUBLICATIONS

T. Ohno, et al., Direct observation of dislocations propagated from 4H-SiC substrate to epitaxial layer by X-ray topography, Journal of Crystal Growth, vol. 260, 2004, pp. 209-216.
Z. Zhang and T.S. Sudarshan, "Growth of low basal plane dislocation density SiC epitaxial layers". Materials Science Forum, vols. 527-529, 2006, pp. 243-246.
Mrinal K. Das, et al., "Evolution of drift-free, high power 4H-SiC PiN diodes", Materials Science Form, vols. 527-529, 2006, pp. 1329-1334.
Hiroaki Saitoh and Tsunenobu Kimoto, "4H-SiC epitaxial growth on SiC substrates with various off-angles", Materials Science Forum, vols. 483-485, 2005, pp. 89-92.
Hiroshi Nakagawa et al., "Self-ordering of nanofacets on vicinal SiC surfaces", Physical Review Letters, vol. 91, No. 22, Nov. 28, 2003, pp. 226107-1-226107-4.

* cited by examiner

*Primary Examiner* — Minh-Loan T Tran
*Assistant Examiner* — Fazli Erdem
(74) *Attorney, Agent, or Firm* — Stites & Harbison, PLLC; Juan Carlos A. Marquez, Esq

(57) ABSTRACT

A buffer layer configured of the same conductive semiconductor layers of two or more layers as a drift layer is installed by epitaxial growth between a first semiconductor layer configuring the drift layer that is a layer in which components of the semiconductor device are made and a base substrate including a silicon carbide single crystal wafer. A step of donor concentration is provided at an interface between the drift layer and the buffer layer, an interface between the semiconductor layers configuring the buffer layer, and an interface between the buffer layer and the base substrate and the donor concentration of the drift layer side is lower than that of the base substrate side, thereby making it possible to convert most basal plane dislocations into threading edge dislocations as compared to the drift layer having one layer or the buffer layer configured of one layer.

6 Claims, 13 Drawing Sheets

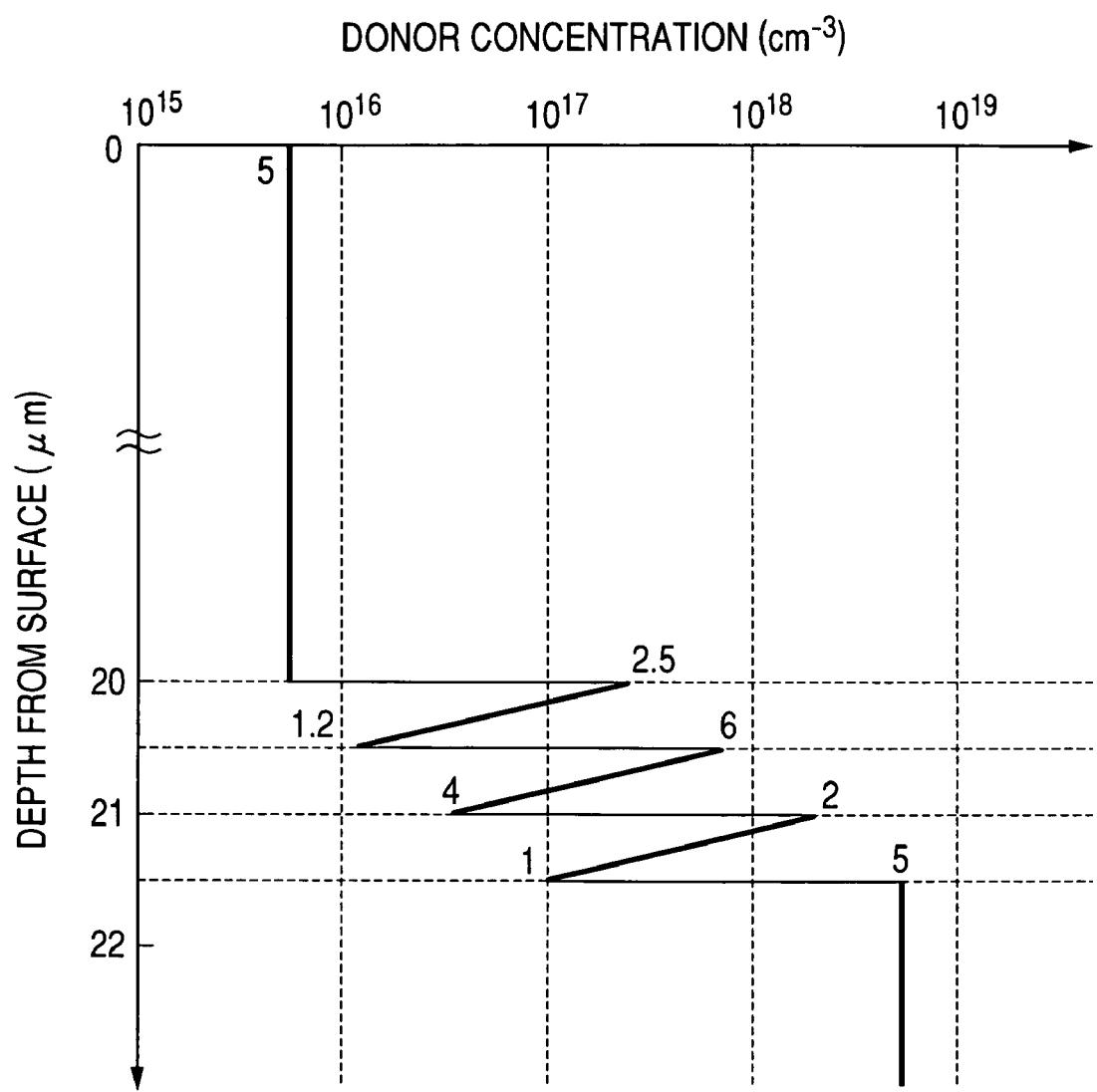

SILICON CARBIDE SEMICONDUCTOR SUBSTRATE AND METHOD OF MANUFACTURING THE SAME

CLAIM OF PRIORITY

The present application claims priority from Japanese patent application JP 2008-146711 filed on Jun. 4, 2008, the content of which is hereby incorporated by reference into this application.

BACKGROUND OF THE INVENTION

1. Field of the Invention

The present invention relates to a silicon carbide semiconductor substrate and a method of manufacturing the same.

2. Description of the Related Art

Since silicon carbide (SiC) has a larger band gap and a higher electric breakdown field than silicon (Si), it is expected to be applied to a semiconductor device (power device) for next generation power control. Even though it is known that silicon carbide has many crystal structures, 4H—SiC and 6H—SiC having a hexagonal crystal structure among these crystal structures are used to manufacture a practical power device.

Since there is a need to conduct a large current into a semiconductor device, many power devices have a structure where an electrode is installed on one surface and a rear surface of the device, respectively, to flow main current therebetween. Further, a need exists for a function to realize a state (turn-on state) where main current is conducted and a state (turn-off state) where main current is interrupted. In the turn-on state, it is important to reduce resistance (on-resistance), which is generated by conduction current, as much as possible such that a loss of the device can be reduced. Moreover, in the turn-off state, there is a need to maximally reduce leakage current with respect to a predetermined applied voltage.

In order for the power device to have the above-mentioned functions by using silicon carbide, the silicon carbide power device generally has a structure where an n-type silicon carbide single crystal wafer having a low resistance is used as a base substrate and a single crystal silicon carbide layer having a predetermined thickness and a donor concentration is formed on the base substrate by epitaxial growth. A basic structure of the semiconductor device including a p-n junction, etc., is made inside the silicon carbide epitaxial layer. The semiconductor device is optimally designed so that the epitaxial layer has high resistance, the donor concentration and thickness thereof satisfy a withstand voltage value, which is a specification of the device, and the on-resistance is small if possible. As such, the reason to use the epitaxial layer installed on the silicon carbide single crystal wafer in forming the device is that the required thickness of the high-resistance silicon carbide layer is a degree from several microns to several tens of microns, which is sufficiently thinner as compared to that of the high-resistance layer necessary for the device using silicon in the related art.

In developing the silicon carbide single crystal wafer, in order to make a diameter large and a length of a wafer ingot long, there is a need to make the surface thereof into a {0001} crystal plane. In the related art, when the silicon carbide single crystal layer is epitaxially grown on the {0001} crystal plane, there is a problem in that silicon carbide having a crystal type (polytype) different from the wafer is mixed. However, the problem is solved by making the surface of the epitaxially grown wafer into a surface inclined by several degrees from the {0001} crystal plane, making it possible to easily form the silicon carbide crystal layer having the same polytype as the wafer. The 4H—SiC wafer, which is being marketed currently, is a wafer whose {0001} crystal plane is inclined by 4° or 8°.

An attempt to improve the quality of the silicon carbide single crystal wafer while developing a technology of making the diameter thereof large has actively been progressed. However, linear single crystal structure defects called dislocations of 1000 to 10000 per square centimeter in the silicon carbide single crystal wafer still exist even in the present time. It has been known that the silicon carbide has three kinds of dislocations. These dislocations are threading screw dislocation and threading edge dislocation where a direction of a dislocation line is approximately perpendicular to the {0001} crystal plane and basal plane dislocation where a direction of a dislocation line is parallel with the {0001} crystal plane. Generally, the dislocations inside the crystal are specified by a Burgers vector and the direction of the dislocation line. The threading edge dislocation and the basal plane dislocation in the silicon carbide have the same Burgers vector, but they are distinguished by a difference in the direction of the dislocation line.

If one end of the dislocation line is exposed on the surface of the wafer, these dislocations in the silicon carbide single crystal wafer are inherited to the epitaxial growth layer when the silicon carbide single crystal layer is epitaxially grown on the wafer. When the wafer surface is parallel with the {0001} crystal plane, the basal plane dislocation is not inherited to the epitaxial growth layer without being exposed on the surface of the wafer. However, as described above, when the {0001} crystal plane inclines, a part of the basal plane dislocation on the plane is exposed on the surface of the wafer, such that it is propagated to the epitaxial growth layer. At this time, most of the propagated basal plane dislocations become the threading edge dislocation in the epitaxial growth layer by changing the direction of the dislocation line to a direction perpendicular to the {0001} crystal plane but about 10 to 20% of the basal plane dislocation exposed on the surface of the wafer is inherited into the epitaxial layer as the basal plane dislocation as it is, which is disclosed in pp 209 to 216, volume 260, Journal of Crystal Growth. On the other hand, the threading edge dislocation exposed on the surface of the wafer is propagated into the epitaxial layer as approximately 100% threading edge dislocation and the conversion from the threading edge dislocation into the basal plane dislocation is not almost generated, which is described in the same Journal of Crystal Growth.

Studies on any influence of the dislocations in the epitaxially grown silicon carbide on performance or reliability of the device have been actively progressed. Although the influence is not still completely understood, it is clear to be a cause that allows the basal plane dislocation in the epitaxial layer to increase on-resistance when a p-n junction diode is conducted for a long time, and to deteriorate reliability of a gate oxide film of a metal-oxide semiconductor field effect transistor (MOSFET). On the other hand, it is known that a part of the threading screw dislocation influences the device, but the details thereof are not clear. Further, the influence of the threading edge dislocation on the device has not been known until now. Therefore, it is preferable that the basal plane dislocation exists as small as possible or does not exist at all, if possible, in the epitaxial layer in which all structures of the device are made. For this reason, it is preferable to remarkably reduce the basal plane dislocation, if possible, in the silicon carbide single crystal wafer that is a substrate, but it is not yet an object to reduce dislocation density. Therefore, a technology to inherit the basal plane dislocation into the epitaxial layer itself while reducing a ratio thereof when the basal plane dislocation exposed on the surface the silicon carbide single crystal wafer is propagated to the epitaxial growth layer, that is, a technology to improve conversion efficiency from the basal plane dislocation into the threading edge dislocation when the basal plane dislocation of the wafer is propagated to the epitaxial growth layer has been considered as an important technology.

SUMMARY OF THE INVENTION

As a method of reducing the basal plane dislocation density in the epitaxial layer by improving the conversion efficiency from the basal plane dislocation of the wafer into the threading edge dislocation in the epitaxial layer, there is a method of forming concave parts on the silicon carbide single crystal wafer at the center of the dislocation by selectively performing etching on a part of the basal plane dislocation exposed on the surface of the silicon carbide single crystal wafer and growing the epitaxial layer on the silicon carbide single crystal wafer, as described in Japanese Unexamined Patent Application Publication No. 2007-506289, for example. In the epitaxial layer formed as described above, the basal plane dislocation density is remarkably reduced as described in pp. 243 to 246, volume 527-529, Material Science Forum.

However, as described in pp. 1329 to 1334, volume 527-529, Material Science Forum, in the p-n junction diode made in the epitaxial layer, the reliability of characteristics in the turn-on state is certainly improved by the reduction of the basal plane dislocation density, while the reliability of characteristics of the turn-off state are deteriorated. This is considered to be caused by the occurrence of separate crystal defects around the concave parts since the epitaxial layer is grown on the wafer having the concave parts. As such, the method of forming concave parts by selectively performing etching on a part of the basal plane dislocation exposed on the surface of the silicon carbide single crystal wafer and growing the epitaxial layer on the silicon carbide single crystal wafer having the concave part formed thereon is suitable to reduce the basal plane dislocation density, but overall, it is not suitable as the method of forming the epitaxial layer to make the semiconductor device. A need exists for a method of reducing the basal plane dislocation density in the epitaxial layer without anything influencing the film quality of the epitaxial layer.

Therefore, it is an object of the present invention to provide a method of reducing basal plane dislocation density in an epitaxial layer without having a negative effect, such as damage, etc, on the film quality of an epitaxial layer in a silicon carbide semiconductor substrate.

FIG. 1 is a pattern diagram showing an outline of a cross section of a silicon carbide semiconductor substrate according to an embodiment of the present invention and sizes of donor concentration of each layer configured, but the present invention is not necessarily limited thereto. According to the present invention, a silicon carbide semiconductor substrate is configured of a base substrate 11 formed of a silicon carbide single crystal wafer and a silicon carbide epitaxial growth layer 12 formed on one surface thereof, wherein a buffer layer 14 (hereinafter, referred to as a dislocation conversion layer) made of silicon carbide having high conversion efficiency converting basal plane dislocation into threading edge dislocation when the basal plane dislocation in the silicon carbide single crystal wafer is propagated into the epitaxial growth layer is mounted between the base substrate 11 and the silicon carbide epitaxial layer 13 (hereinafter, referred to as a drift layer) in which components of a device are made, by epitaxial growth.

The inventors obtained the following findings by performing basic experiments on conditions for forming the dislocation conversion layer. First, when the base substrate is an n type having low resistance, that is, a silicon carbide single crystal wafer of high donor concentration, the smaller the donor concentration of the epitaxial layer, the larger the ratio converted into the threading edge dislocation becomes when the basal plane dislocation in the wafer is propagated into the epitaxial layer. Second, the conversion from the basal plane dislocation into the threading edge dislocation is a phenomenon generated in the vicinity of an interface between the base substrate and the epitaxial growth layer and the conversion is not generated while the epitaxial is grown.

When the basal plane dislocation is propagated at the interface between the silicon carbide single crystal wafer having high donor concentration and the epitaxial layer having low concentration, the basal plane dislocation is converted into the threading edge dislocation. The reason why the smaller the donor concentrations of the epitaxial layer, the larger the conversion ratio becomes is as follows. Nitrogen, which is an n-type dopant, is substituted into a carbon site in silicon carbide, such that it is donor, but a tetrahedral coordination covalent radius of carbon is 0.077 nm, while tetrahedral coordination covalent radius of nitrogen is 0.070 nm smaller than that of carbon. Therefore, the crystal of silicon carbide reduces with the doping of nitrogen. Since the donor concentration of the base substrate is usually $10^{18}$ cm$^{-3}$, while the donor concentration of the epitaxial layer is $10^{14}$ to $10^{17}$ cm$^{-3}$, the crystal of the substrate having larger donor concentration reduces and compression stress is applied to the epitaxial layer in the vicinity of the interface with the substrate. It is considered that compression stress has an effect on the conversion from the basal plane dislocation into the threading edge dislocation. In other words, if there is compression stress in the epitaxial layer, it is considered that the basal plane dislocation propagated from the substrate is difficult to transmit as it is and is subjected to the operation such as the conversion into the threading edge dislocation by being bent, from the epitaxial layer. Since the smaller the donor concentration of the epitaxial layer, the larger the donor concentration difference with the substrate becomes, compression stress in the epitaxial layer becomes large as well. It is considered that as the donor concentration of the epitaxial layer is smaller than that of substrates, when the basal plane dislocation of the wafer is propagated to the epitaxial layer; thus, the ratio converted into the threading edge dislocation is larger.

Although the above description describes the findings and study on the propagation of the basal plane dislocation to the epitaxial layer from the wafer in the case where the silicon carbide epitaxial layer is formed on the silicon carbide single crystal wafer, it is considered that it is similarly applied to a case where a second epitaxial layer having different donor concentration is formed on the silicon carbide epitaxial layer. In other words, when the epitaxial layer having low concentration is formed on the silicon carbide epitaxial layer having high concentration, the basal plane dislocation propagated from the silicon carbide epitaxial layer side having high concentration to the epitaxial layer having low concentration is converted into the threading edge dislocation and it is estimated that the larger the donor concentration difference therebetween, the larger the conversion efficiency becomes.

In the present invention, in order to improve the conversion efficiency from the basal plane dislocation into the threading edge dislocation, the dislocation conversion layer is configured of silicon carbide layers of at least two layers, a step of the donor concentration exists at the interfaces between each layer, that is, the interface between the drift layer and the silicon carbide layer configuring the dislocation conversion layer, the interface between the silicon carbide layers in the dislocation conversion layer, and the interface between the silicon carbide layer configuring the dislocation conversion layer and the base substrate, and the drift layer side of the interface has the donor concentration lower than the base substrate side. FIG. 1 shows an example where a dislocation conversion layer 14 is configured of silicon carbide layers 141, 142, and 143 of three layers. In this case, the donor concentrations of the silicon carbide layers 141, 142, and 143 become sequentially low in this order, the donor concentration of the silicon carbide layer 143 of the drift layer side at the top portion is higher than that of the contacting drift layer 13, and the donor concentration of the silicon carbide layer 141 of the base substrate side at the bottom portion is lower than that of the contacting base substrate 11. As a result, in FIG. 1, the step of the donor concentration exists at an interface 15 between the base substrate 11 and the silicon carbide layer 141 of the base substrate side at the bottom portion configuring the dislocation conversion layer, interfaces 16 and 17 between the silicon carbide layers in the dislocation conversion layer 14, and an interface 18 of the silicon carbide layer of the drift layer side at the top portion configuring the dislocation conversion layer, and the drift layer and the donor concentration of the drift layer side of the interface is lower than that of the base substrate side.

In the silicon carbide semiconductor substrate of the present invention, the step of the donor concentration exists at the interface between the base substrate and the silicon carbide layer configuring the dislocation conversion layer, the interface between the silicon carbide layers in the dislocation conversion layer, the interface between the silicon carbide layer configuring the dislocation conversion layer and the drift layer. When the basal plane dislocation is propagated by passing through these interfaces, it is efficiently converted into the threading edge dislocation in these interfaces. When the drift layer is formed to be directly contacted on the base substrate, since the interface is one, the conversion is performed only once. In the present invention, however, since the silicon carbide layer having two or more layers is mounted between the base substrate and the drift layer, the interface has three or more planes during reaching from the base substrate to the drift layer. Therefore, the chance of converting from the basal plane dislocation into the threading edge dislocation is three times or more and the conversion efficiency becomes extremely high. FIG. 1 shows an example where the interface is four.

Although the embodiment of FIG. 1 according to the present invention describes a technology of installing the silicon carbide layer having two or more layers between the base substrate 11 and the drift layer 13, which has the donor concentration larger than that of the drift layer 13 but smaller than that of the base substrate 11 and has the donor concentration sequentially reduced from the base substrate side to the drift layer side, for example, as disclosed in Japanese Patent Application Laid-Open publication No. 2003-318388, there is a technology of installing the buffer layer configured of one layer between the base substrate and the drift layer, which has the donor concentration larger than that of the drift layer but smaller than the base substrate. FIG. 2 shows an example of the technology. With the above Japanese Patent Application Laid-Open Publication No. 2003-318388, although the buffer layer 23 is to obtain an effect that it is difficult for a depletion layer extended in a direction from the upper portion of the drift layer 22 to a base substrate 21 to reach the base substrate 21 when the semiconductor device is turned-off, it can also have a function as the dislocation conversion layer. In this case, however, since the buffer layer 23 is formed of one layer and the interfaces 24 and 25 to which the basal plane dislocation is propagated are formed of two planes, the chance of converting the basal plane dislocation into the threading edge dislocation is twice. The present invention improves the technology to increase the conversion efficiency of the basal plane dislocation into the threading edge dislocation.

As described above, in the conversion of the basal plane dislocation, which is propagated from the silicon carbide epitaxial layer having high donor concentration (or silicon carbide single crystal wafer) to the epitaxial layer having low donor concentration, into the threading edge dislocation, the larger the donor concentration difference therebetween, the larger the conversion efficiency becomes and the more the number of interfaces generating the conversion, the larger the conversion chance becomes. For this reason, it is considered that it is effective to increase the conversion efficiency by providing the concentration gradient where the donor concentration slowly increases from the lower portion toward the upper portion in the silicon carbide layer so that the donor concentration difference in the interface is large, rather than making the donor concentration uniform in a thickness direction in the silicon carbide layer configuring the dislocation conversion layer. FIGS. 3A and 3B show such an embodiment.

In FIG. 3A, the silicon carbide layer configuring the dislocation conversion layer 33 is formed of three layers and is the same as the embodiment of FIG. 1. However, the donor concentration in silicon carbide layers 331, 332, and 333 configuring a dislocation conversion layer 33 is not uniform in a thickness direction in each layer, but has the concentration gradient where the donor concentration increases from a base substrate 31 side toward a drift layer 32 side is provided. As a result, the donor concentration difference in the interfaces 34, 35, 36, and 37 becomes large as compared to the case of the embodiment of FIG. 1.

FIG. 3B shows the silicon carbide layer configuring the dislocation conversion layer 303, wherein the silicon carbide layer is formed of two layers. Further, the donor concentration in a silicon carbide layer 3032 configuring the dislocation conversion layer 303 is uniform in a thickness direction in each layer, but the donor concentration in a silicon carbide layer 3031 has the concentration gradient where the donor concentration increases from a base substrate 301 side toward a drift layer 302 side. As described above, it is also possible to appropriately combine the case where the donor concentration is uniform in the thickness direction in the silicon carbide layer configuring the dislocation conversion layer and the case where the gradient is provided.

The conversion of the basal plane dislocation, which is propagated from the silicon carbide epitaxial layer (or base substrate) having high donor concentration to the epitaxial layer having low donor concentration, into the threading edge dislocation can improve the silicon carbide semiconductor substrate of FIG. 2 according to the related art by using the finding that the larger the donor concentration difference therebetween, the larger the conversion efficiency becomes. FIG. 4 shows such an embodiment of the invention. In FIG. 4, the silicon carbide layer configuring a dislocation conversion layer 43 is formed of one layer and is the same as the conventional example of FIG. 2. However, the donor concentration in the silicon carbide layer configuring the dislocation conversion layer 43 is not uniform in the thickness direction in each layer, but has the concentration gradient where the donor concentration increases from a base substrate 41 side to a drift layer 42 side. As a result, the donor concentration differences in interfaces 44 and 45 become larger than those in the interfaces 24 and 25 of the conventional example of FIG. 2, respectively. As such, although the layer configuration is the same as the conventional example, it is possible to further reduce the basal plane dislocation density in the drift layer than that of the conventional example by making the donor concentration difference in the interface large.

In the present invention, the dislocation conversion layer and the drift layer that are configured of the silicon carbide layer having two or more layers can be formed by epitaxially growing the silicon carbide on the base substrate including the silicon carbide single crystal wafer sequentially by using a chemical vapor deposition (CVD) method and a molecular beam epitaxy (MBE) method. For example, a method that after a predetermined time elapses from starting the growth of the first silicon carbide layer in the dislocation conversion layer on the base substrate, rapidly changes over an additive amount of nitrogen gas, which is a donor, to start the growth of the second silicon carbide layer in the dislocation conversion layer without stopping the supply of raw material gas, that is, stopping the growth, i.e., a method of performing a continuous growth while changing over growth conditions step by step without stopping the growth is considered. On the other hand, a intermittent growth method that after the epitaxial growth layer, which is the first silicon carbide layer in the dislocation conversion layer on the base substrate reaches a predetermined thickness, stops the growth once, stops the supply of raw material gas, and temporally maintains the epitaxial growth layer in atmosphere from 1400° C. to 1600° C. and then, starts the growth of the epitaxial layer, which is the second silicon carbide layer, and repeats a process of stopping the growth again after the epitaxial growth layer reaches a predetermined thickness can also be considered. The latter intermittent growth method can further increase the conversion of the basal plane dislocation into the threading edge dislocation in each interface since the surface of the existing epitaxial layer is processed in an optimal state by maintaining the epitaxial layer in the high-temperature atmosphere before starting the growth of the next epitaxial layer. As the atmosphere conditions when the growth stops, a hydrogen stream is general, but a mixed atmosphere of hydrogen and hydrocarbon gas such as propane, etc., is also considered.

As described above, with the present invention, it is possible to reduce the basal plane dislocation density in the drift layer without causing new defects in the drift layer. Further, the silicon carbide single crystal wafer (silicon carbide epi wafer) to which the epitaxial layer adopting the present invention is attached is completely the same as the silicon carbide epi wafer of the related art and thus, can be used to form the device. In other words, it is possible to make the semiconductor device such as diodes, transistors, etc., in the drift layer whose basal plane dislocation density remarkably reduces by the present invention.

The p-type layer including p-type impurities is installed on the upper portion of the drift layer or in the drift layer of the silicon carbide semiconductor substrate of the present invention and the upper electrode installed to be contacted to the p-type layer and the lower electrode installed to be contacted to the base substrate are provided, such that it is possible to realize the p-n junction diode with improved reliability in the turn-on state without damaging the characteristics in the turn-off state.

Moreover, the p-type layer including p-type impurities is installed on the upper portion of the drift layer or in the drift layer of the silicon carbide semiconductor substrate of the present invention and the upper electrode installed to be contacted to the drift layer and the p-type layer and the lower electrode installed to be contacted to the base substrate are provided, such that the reliability in turn-on state of a diode where a Schottky barrier and the p-n junction are combined with each other can be improved without damaging the characteristics in the turn-off state.

Further, the p-type layer serving as the channel including p-type impurities is installed on the upper portion of the drift layer or in the drift layer of the silicon carbide semiconductor substrate of the present invention and a gate insulating film installed on the surface of the p-type layer, a gate electrode installed on the gate insulating film, an n-type source layer having higher donor concentration than that of the drift layer installed on the upper part of the p-type layer or in the p-type layer, a source electrode installed to be contacted to the source layer, and a drain electrode installed to be contacted to the base substrate are provided, such that the reliability of a MOSFET in a vertical structure can be improved.

With one embodiment of the present invention, it is possible to provide the silicon carbide semiconductor substrate including the semiconductor layer having the small basal plane dislocation density for the base substrate including the silicon carbide semiconductor single crystal.

Further, it is possible to provide the drift layer having the small basal plane dislocation density and form the semiconductor device in the drift layer by using the silicon carbide semiconductor substrate.

BRIEF DESCRIPTION OF THE DRAWINGS

FIG. 9F is a schematic diagram showing a change in a thickness direction of donor concentration of a silicon carbide semiconductor substrate according to a third embodiment of the present invention;

DETAILED DESCRIPTION OF THE PREFERRED EMBODIMENTS

Hereinafter, embodiments of the present invention will be described with reference to the accompanying drawings.

First Embodiment

Figure 1:
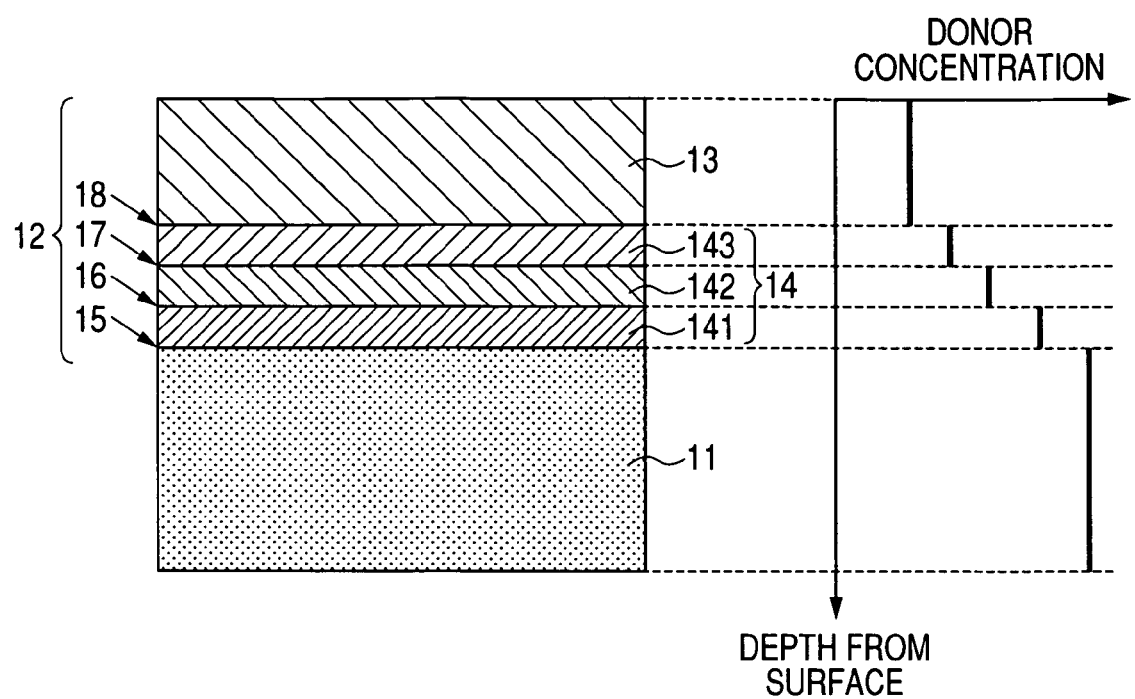
FIG. 1 is a cross-sectional view showing a configuration of a silicon carbide semiconductor substrate according to an embodiment of the present invention and a schematic diagram showing a change in a thickness direction of donor concentration.
Figure 2:
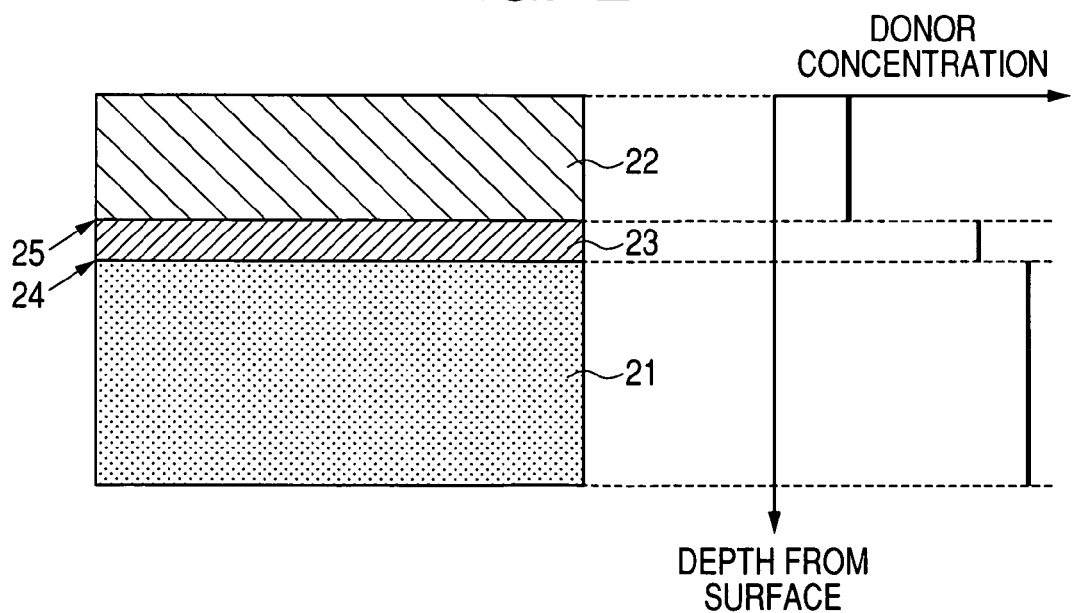
FIG. 2 is a cross-sectional view showing a configuration of a silicon carbide semiconductor substrate according to the related art and a schematic diagram showing a change in a thickness direction of donor concentration.

As a first embodiment of the present invention, a method of manufacturing a silicon carbide semiconductor substrate having a cross-sectional structure shown in FIG. 1 will be described.

FIGS. 5A to 5E are cross-sectional views showing a manufacturing process of a silicon carbide semiconductor substrate according to the first embodiment.

Figure 5A:
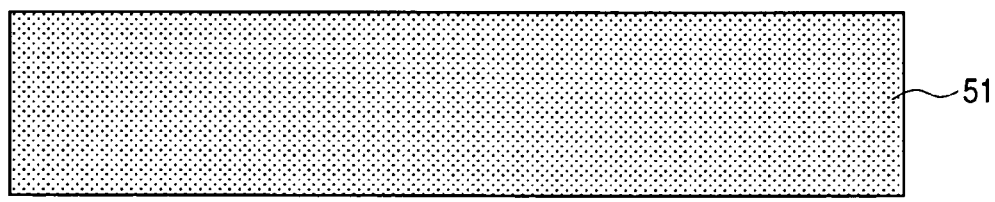
FIG. 5A is a cross-sectional view showing a manufacturing process of a silicon carbide semiconductor substrate according to a first embodiment of the present invention.

First, in the process shown in FIG. 5A, a base substrate 51 including a silicon carbide single crystal wafer is prepared. The silicon carbide single crystal wafer is an n-type 4H—SiC having a diameter of 50 mm and a (0001) Si plane inclined by 8° in a [11-20] direction, wherein donor concentration is $5 \times 10^{18}$ cm$^{-3}$. The silicon carbide single crystal wafer having a {0001} plane is a plane polarity, wherein one is a Si plane (described as a (0001) Si plane) whose outermost surface is made of silicon atoms and the other is a C plane (described as a (000-1) C plane) whose outermost surface is made of carbon atoms. The first embodiment uses the Si plane side. When using the C plane side, growth conditions are somewhat different, but the manufacturing process of the silicon carbide semiconductor substrate itself is similar to the case of the Si plane. The surface of the Si plane side of the used wafer is subjected to a mechanical mirror polishing and then a CMP process.

Further, the silicon carbide single crystal wafer used in the first embodiment uses a {0001} crystal plane inclined by 8° as described above. The large inclined angle of the wafer substrate, which is a base, has an advantage that can easily obtain an epitaxial film having a good surface state, but has a disadvantage in that it increases basal plane dislocation exposed on a substrate surface. So far, an experimental example of epitaxial growth onto a substrate surface where the {0001} crystal plane is maximally inclined by 45° is reported (see pp. 89 to 92, volume 483-485, Materials Science Forum.

However, a result where surface free energy is minimized when the inclination is 13° to 14° is reported (see pp. 226017, volume 91, Physical Review Letters). Therefore, as the condition of obtaining the preferable epitaxial film, the inclination of the {0001} crystal plane should be maintained to be smaller than 15°.

Figure 5B:
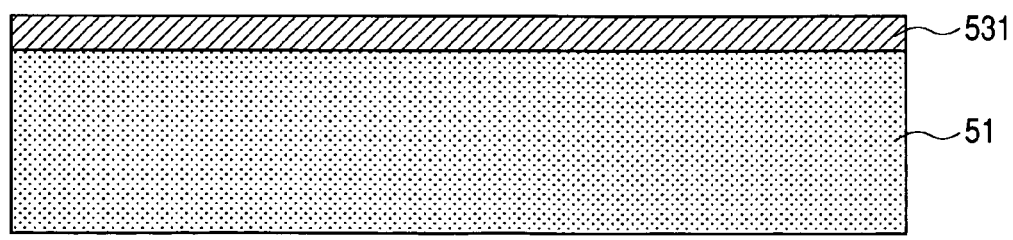
FIG. 5B is a cross-sectional view showing a manufacturing process of a silicon carbide semiconductor substrate according to a first embodiment of the present invention.

Next, in the process shown in FIG. 5B, the base substrate 51 of FIG. 5A is subjected to an RCA cleaning and then installed in a susceptor of a reactor in a hot-wall CVD system. Next, the reactor is decompressed until a vacuum degree of $3 \times 10^{-5}$ Pa or less. Subsequently, hydrogen, which is a carrier gas, is supplied at a flow rate of 20 slm by a gas supply system and a pressure of the reactor becomes 13.3 kPa. In the state of maintaining a flow rate of hydrogen gas, the susceptor is heated by using an RF inductive heating apparatus.

When the susceptor reaches 1400° C., the temperature is maintained for 5 minutes in a hydrogen stream. After five minutes elapse, the temperature of the susceptor increases again and when the temperature reaches 1500° C., it is maintained at the temperature. Thereafter, a propane gas of 0.9 sccm is supplied to the reactor. Then, a monosilane gas of 3.0 sccm and a nitrogen gas of 10 sccm are simultaneously supplied to the reactor. The growth of the silicon carbide epitaxial film starts by the supply of the monosilane gas. A silicon carbide layer 531 having a thickness of about 0.5 μm is epitaxially grown on the Si plane of the base substrate 51 by being maintained for 7 minutes under this state. The donor concentration of the silicon carbide layer 531 is estimated as $1 \times 10^{18}$ cm$^{-3}$ by the result of the previously performed preliminary experiment.

Figure 5C:
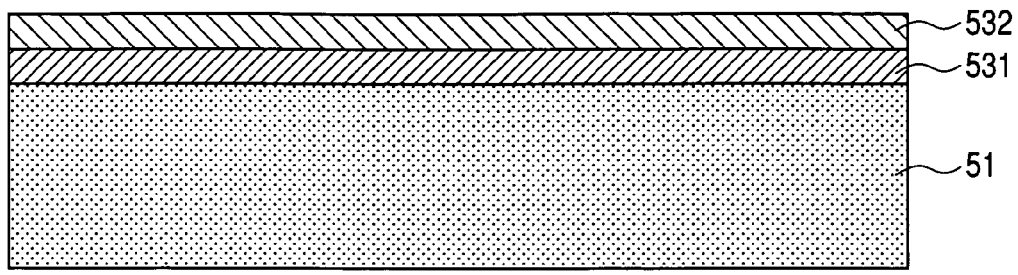
FIG. 5C is a cross-sectional view showing a manufacturing process of a silicon carbide semiconductor substrate according to a first embodiment of the present invention.

Next, in the process shown in FIG. 5C, as soon as the maintenance time to grow the silicon carbide layer 531 elapses, the flow rate of the nitrogen gas becomes 1.5 sccm. The time required to change the flow rate of the nitrogen gas is about 1 second. Other growth conditions do not change. A silicon carbide layer 532 having a thickness of about 0.5 μm is epitaxially grown on the silicon carbide layer 531 by being maintained for 7 minutes under this state. The donor concentration of the silicon carbide layer 532 is estimated as $1 \times 10^{17}$ cm$^{-3}$ by the result of the previously performed preliminary experiment.

Figure 5D:
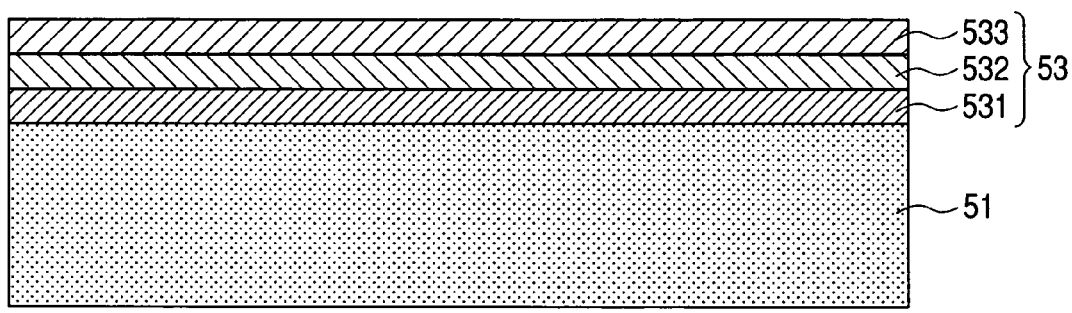
FIG. 5D is a cross-sectional view showing a manufacturing process of a silicon carbide semiconductor substrate according to a first embodiment of the present invention.

Next, in the process shown in FIG. 5D, as soon as the maintenance time to grow the silicon carbide layer 532 elapses, the flow rate of the nitrogen gas becomes 0.3 sccm. The time required to change the flow rate of the nitrogen gas is about 1 second. Other growth conditions are not changed. A silicon carbide layer 533 having a thickness of about 0.5 μm is epitaxially grown on the silicon carbide layer 532 by being maintained for 7 minutes under this state. The donor concentration of the silicon carbide layer 533 is estimated as $2 \times 10^{16}$ cm$^{-3}$ by the result of the previously performed preliminary experiment. The silicon carbide layers 531, 532, and 533 configure a dislocation conversion layer 53.

Figure 5E:
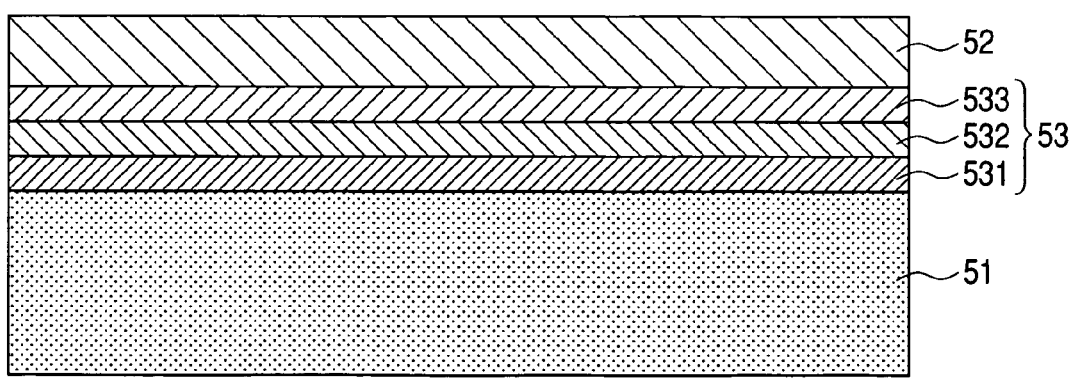
FIG. 5E is a cross-sectional view showing a manufacturing process of a silicon carbide semiconductor substrate according to a first embodiment of the present invention.

Next, in the process shown in FIG. 5E, as soon as the maintenance time to grow the silicon carbide layer 533 elapses, the flow rate of the monosilane gas becomes 6.0 sccm, the flow rate of the propane gas becomes 2.4 sccm, and the flow rate of the nitrogen gas becomes 1.0 sccm. The time required to change the flow rate of the monosilane gas, the flow rate of the propane gas, and the flow rate of the nitrogen gas is about 1 second. Other growth conditions are not changed. A drift layer 52 having a thickness of about 20 μm is epitaxially grown on the silicon carbide layer 533 by being maintained for 120 minutes under this state.

After the drift layer is formed, the supply of the monosilane gas and the nitrogen gas stops. Next, the supply of the propane gas stops. Subsequently, the RF heating stops and it is cooled down in a hydrogen stream.

After the temperature of the susceptor sufficiently reduces, the supply of hydrogen stops and after the inside of the reactor is exhausted, the substrate is then taken out. The donor concentration of the drift layer becomes $5 \times 10^{15}$ cm$^{-3}$.

The silicon carbide semiconductor substrate according to the first embodiment is formed by the above process. An etch pit is formed on the silicon carbide semiconductor substrate by using a potassium hydroxide melting solution and the basal plane dislocation density is obtained as 23 cm$^{-2}$.

Figure 6A:
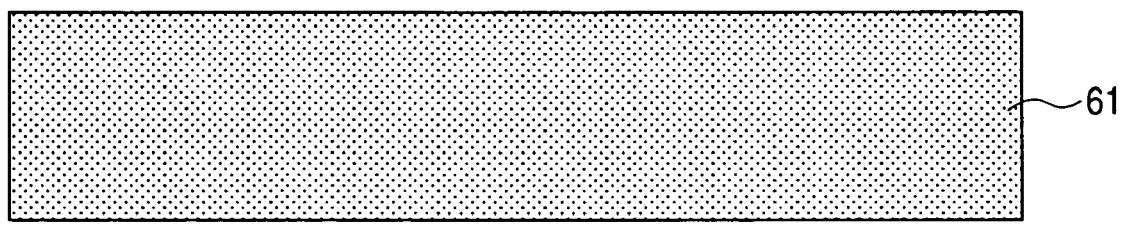
FIG. 6A is a cross-sectional view showing a manufacturing process of a silicon carbide semiconductor substrate according to a first comparative example.
Figure 6B:
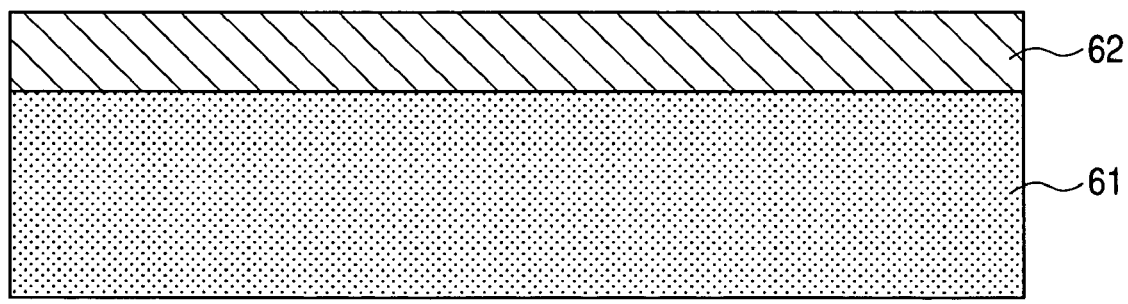
FIG. 6B is a cross-sectional view showing a manufacturing process of a silicon carbide semiconductor substrate according to a first comparative example.

As the comparative example of the first embodiment, the drift layer is formed without installing the dislocation conversion layer. This becomes a first comparative example. FIGS. 6A and 6B are cross-sectional views showing a manufacturing process of the silicon carbide semiconductor substrate according to the first comparative example.

First, in the process shown in FIG. 6A, a base substrate 61 including the silicon carbide single crystal wafer is prepared. The silicon carbide single crystal wafer is the n-type 4H—SiC having a diameter of 50 mm and a (0001) Si plane inclined by 8° in a [11-20] direction, wherein the donor concentration is $5 \times 10^{18}$ cm$^{-3}$. The surface of the Si plane side of the wafer is subjected to the mechanical mirror polishing and then the CMP process.

Next, in the process shown in FIG. 6B, the base substrate 61 of FIG. 6A is subjected to the RCA cleaning and then installed in a susceptor of a reactor in the hot-wall CVD system and the reactor is decompressed until a vacuum degree of $3 \times 10^{-5}$ Pa or less. Subsequently, hydrogen, which is a carrier gas, is supplied at a flow rate of 20 slm by the gas supply system and the pressure of the reactor becomes 13.3 kPa. In the state of maintaining the flow rate of the hydrogen gas, the susceptor is heated by using the RF inductive heating apparatus.

When the susceptor reaches 1400° C., the temperature is maintained for 5 minutes in the hydrogen stream. When the susceptor reaches 1500° C., the temperature is maintained and the propane gas of 2.4 sccm is supplied to the reactor. Then, the monosilane gas of 6.0 sccm and the nitrogen gas of 1.0 sccm are simultaneously supplied to the reactor. The growth of the silicon carbide epitaxial film starts by the supply of the monosilane gas. A drift layer 62 having a thickness of about 20 μm is epitiaxially grown on the base substrate 61 by being maintained for 120 minutes under this state.

After the drift layer is formed, the supply of the monosilane gas and the nitrogen gas stops. Next, the supply of the propane gas stops. Subsequently, the RF heating stops and it is cooled down in the hydrogen stream.

After the temperature of the susceptor sufficiently reduces, the supply of hydrogen stops and after the inside of the reactor is exhausted, the substrate is taken out. The donor concentration of the drift layer becomes $5 \times 10^{15}$ cm$^{-3}$.

The first comparative example of the silicon carbide semiconductor substrate according to the first embodiment is formed by the above process. An etch pit is formed on the silicon carbide semiconductor substrate by using a potassium hydroxide melting solution and the basal plane dislocation density is obtained as 113 cm$^{-2}$.

Figure 7A:
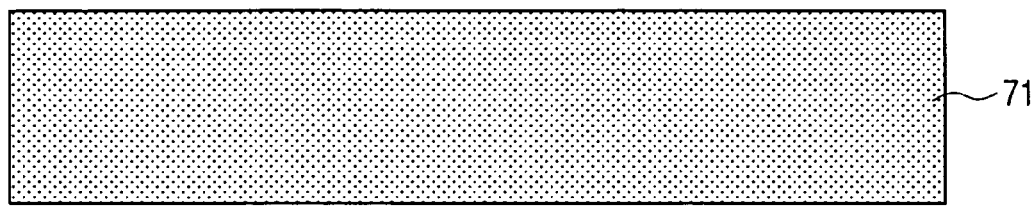
FIG. 7A is a cross-sectional view showing a manufacturing process of a silicon carbide semiconductor substrate according to a second comparative example.
Figure 7B:
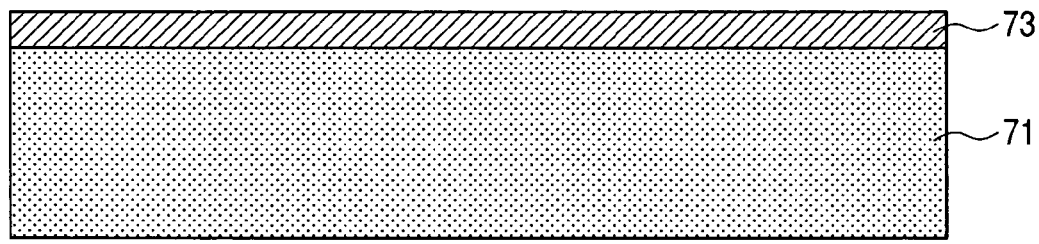
FIG. 7B is a cross-sectional view showing a manufacturing process of a silicon carbide semiconductor substrate according to a second comparative example.
Figure 7C:
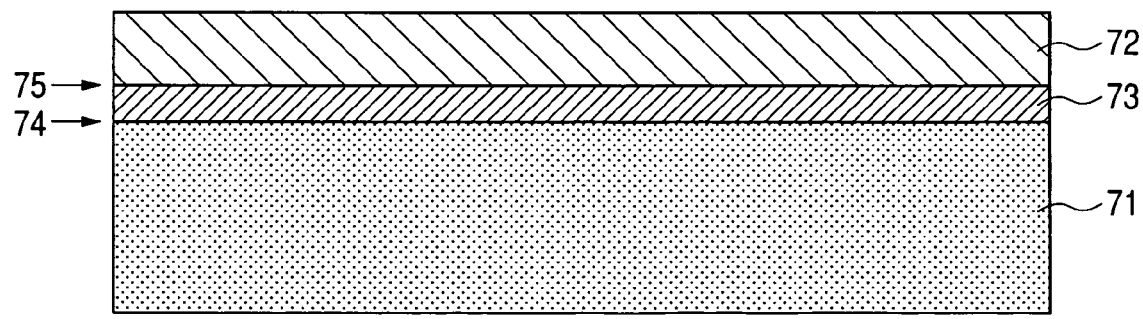
FIG. 7C is a cross-sectional view showing a manufacturing process of a silicon carbide semiconductor substrate according to a second comparative example.

As another comparative example of the first embodiment, the drift layer is formed on the dislocation conversion layer that is formed of one layer. This becomes a second comparative example. FIGS. 7A to 7C are cross-sectional views showing a manufacturing process of the silicon carbide semiconductor substrate according to the second comparative example.

First, in the process shown in FIG. 7A, a base substrate 71 including the silicon carbide single crystal wafer is prepared. The silicon carbide single crystal wafer is the n-type 4H—SiC having a diameter of 50 mm and a (0001) Si plane inclined by 8° in a [11-20] direction, wherein the donor concentration is $5 \times 10^{18}$ cm$^{-3}$. The surface of the Si plane side of the wafer is subjected to the mechanical mirror polishing and then the CMP process.

Next, in the process shown in FIG. 7B, a base substrate 71 of FIG. 7A is subjected to the RCA cleaning and then installed in the susceptor of the reactor in the hot-wall CVD system and the reactor is decompressed until the vacuum degree of $3 \times 10^{-5}$ Pa or less. Subsequently, hydrogen, which is a carrier gas, is supplied at the flow rate of 20 slm by the gas supply system and the pressure of the reactor becomes 13.3 kPa. In the state of maintaining the flow rate of the hydrogen gas, the susceptor is heated by using the RF inductive heating apparatus.

When the susceptor reaches 1400° C., the temperature is maintained for 5 minutes in the hydrogen stream. When the susceptor reaches 1500° C., the temperature is maintained and the propane gas of 0.9 sccm is supplied to the reactor.

Then, the monosilane gas of 3.0 sccm and the nitrogen gas of 10 sccm are simultaneously supplied to the reactor. The growth of the silicon carbide epitaxial film starts by the supply of the monosilane gas. A dislocation conversion layer 73 having a thickness of about 0.5 μm is formed on the base substrate 71 by being maintained for 7 minutes under this state.

Next, in the process shown in FIG. 7C, as soon as the maintenance time to grow the dislocation conversion layer 73 elapses, the flow rate of the monosilane gas becomes 6.0 sccm, the flow rate of the propane gas becomes 2.4 sccm, and the flow rate of the nitrogen gas becomes 1.0 sccm. The time required to change the flow rate of the monosilane gas, the flow rate of the propane gas, and the flow rate of the nitrogen gas is about 1 second. Other growth conditions are not changed. A drift layer 72 having a thickness of about 20 μm is epitaxially grown on the dislocation conversion layer 73 by being maintained for 120 minutes under this state.

After the drift layer is formed, the supply of the monosilane gas and the nitrogen gas stops. Next, the supply of the propane gas stops. Subsequently, the RF heating stops and it is cooled down in the hydrogen stream.

After the temperature of the susceptor sufficiently reduces, the supply of hydrogen stops and after the inside of the reactor is exhausted, the substrate is taken out. The donor concentration of the drift layer becomes $5 \times 10^{15}$ cm$^{-3}$.

The second comparative example of the silicon carbide semiconductor substrate according to the first embodiment is formed by the above process. An etch pit is formed on the silicon carbide semiconductor substrate by using a potassium hydroxide melting solution and the basal plane dislocation density is obtained as 87 cm$^{-2}$.

As described above, the basal dislocation density of the drift layer can be remarkably reduced by installing the dislocation conversion layer 53 of FIGS. 5A to 5E according to the present invention, as compared to the case where the dislocation conversion layer is not installed and the dislocation conversion layer (buffer layer) formed of one layer as in the conventional example.

Second Embodiment

As a second embodiment of the present invention, a manufacturing method different from the first embodiment of the silicon carbide semiconductor substrate having the cross-sectional structure shown in FIG. 1 will be described.

FIGS. 8A to 8E are cross-sectional views showing a manufacturing process of a silicon carbide semiconductor substrate according to the second embodiment.

Figure 8A:
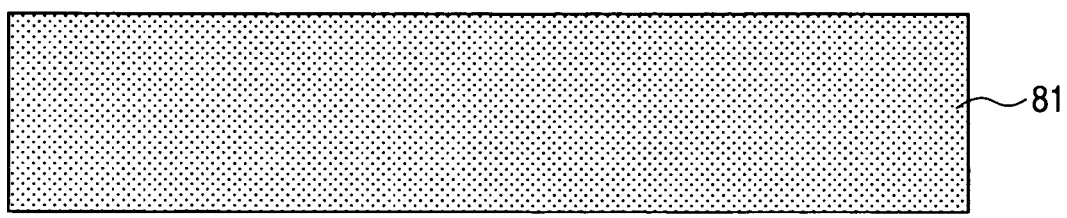
FIG. 8A is a cross-sectional view showing a manufacturing process of a silicon carbide semiconductor substrate according to a second embodiment of the present invention.

First, in the process shown in FIG. 8A, a base substrate 81 including the silicon carbide single crystal wafer is prepared. The silicon carbide single crystal wafer is the n-type 4H—SiC having a diameter of 50 mm and a (0001) Si plane inclined by 8° in a [11-20] direction, wherein the donor concentration is $5 \times 10^{18}$ cm$^{-3}$. The surface of the Si plane side of the wafer is subjected to the mechanical mirror polishing and then the CMP process.

Figure 8B:
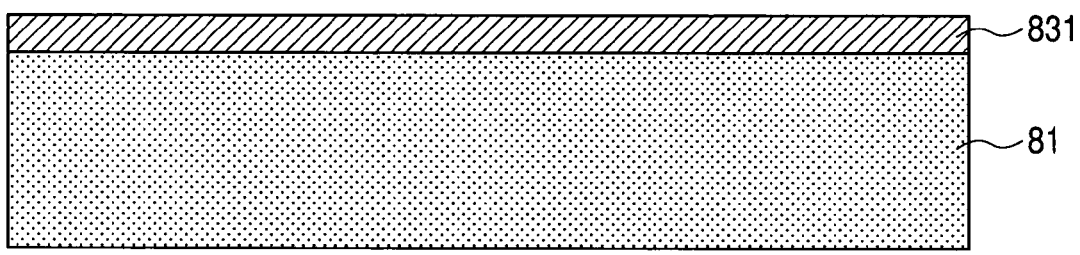
FIG. 8B is a cross-sectional view showing a manufacturing process of a silicon carbide semiconductor substrate according to a second embodiment of the present invention.

Next, in the process shown in FIG. 8B, the base substrate 81 of FIG. 8A is subjected to an RCA cleaning and then installed in a susceptor of a reactor in a hot-wall CVD system. Next, the reactor is decompressed until a vacuum degree of $3 \times 10^{-5}$ Pa or less. Subsequently, hydrogen, which is a carrier gas, is supplied at the flow rate of 20 slm by the gas supply system and the pressure of the reactor becomes 13.3 kPa. In the state of maintaining the flow rate of the hydrogen gas, the susceptor is heated by using the RF inductive heating apparatus.

When the susceptor reaches 1400° C., the temperature is maintained for 5 minutes in the hydrogen stream. After five minutes elapse, the temperature of the susceptor increases again and when the temperature reaches 1500° C., it is maintained at the temperature. Thereafter, a propane gas of 0.9 sccm is supplied to the reactor. Then, the monosilane gas of 3.0 sccm and the nitrogen gas of 10 sccm are simultaneously supplied to the reactor. The growth of the silicon carbide epitaxial film starts by the supply of the monosilane gas. A silicon carbide layer 831 having a thickness of about 0.5 μm is epitaxially grown on the Si plane of the base substrate 81 by being maintained for 7 minutes under this state. The donor concentration of the silicon carbide layer 831 is estimated as $1 \times 10^{18}$ cm$^{-3}$ by the result of the previously performed preliminary experiment.

Figure 8C:
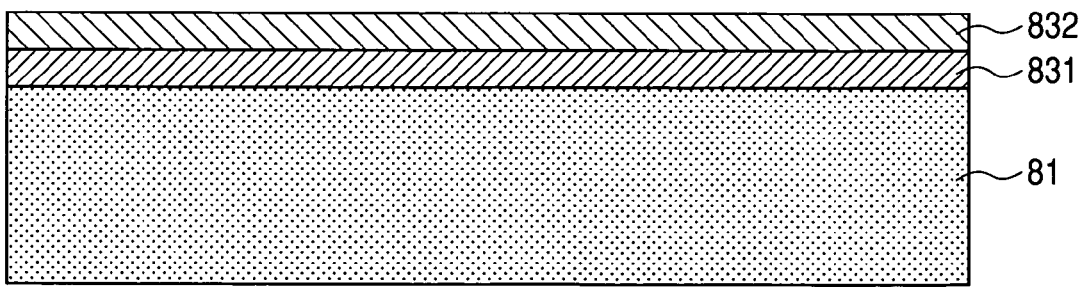
FIG. 8C is a cross-sectional view showing a manufacturing process of a silicon carbide semiconductor substrate according to a second embodiment of the present invention.

Next, in the process shown in FIG. 8C, after the maintenance time to grow the silicon carbide layer 831 elapses, the supply of the monosilane gas, the propane gas, and the nitrogen gas stops, which is maintained at 1500° C. for 30 seconds in the hydrogen stream. Thereafter, the propane gas of 0.9 sccm is supplied to the reactor. Thereafter, the monosilane gas of 3.0 sccm and the nitrogen gas of 1.5 sccm are simultaneously supplied to the reactor. The growth of the silicon carbide epitaxial film starts again by the supply of the monosilane gas. A silicon carbide layer 832 having a thickness of about 0.5 μm is epitaxially grown on the silicon carbide layer 831 by being maintained for 7 minutes under this state. The donor concentration of the silicon carbide layer 832 is estimated as $1 \times 10^{17}$ cm$^{-3}$ by the result of the previously performed preliminary experiment.

Figure 8D:
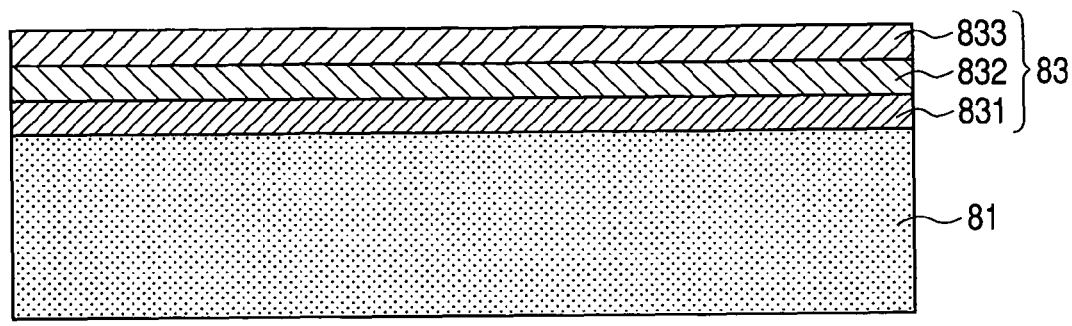
FIG. 8D is a cross-sectional view showing a manufacturing process of a silicon carbide semiconductor substrate according to a second embodiment of the present invention.

Next, in the process shown in FIG. 8D, after the maintenance time to grow the silicon carbide layer 832 elapses, the supply of the monosilane gas, the propane gas, and the nitrogen gas stops, which is maintained at 1500° C. for 30 seconds in the hydrogen stream. Thereafter, the propane gas of 0.9 sccm is supplied to the reactor. Then, the monosilane gas of 3.0 sccm and the nitrogen gas of 0.3 sccm are simultaneously supplied to the reactor. The growth of the silicon carbide epitaxial film starts again by the supply of the monosilane gas. A silicon carbide layer 833 having a thickness of about 0.5 μm is epitaxially grown on the silicon carbide layer 832 by being maintained for 7 minutes under this state. The donor concentration of the silicon carbide layer 833 is estimated as $2 \times 10^{16}$ cm$^{-3}$ by the result of the previously performed preliminary experiment. The silicon carbide layers 831, 832, and 833 configure a dislocation conversion layer 83.

Figure 8E:
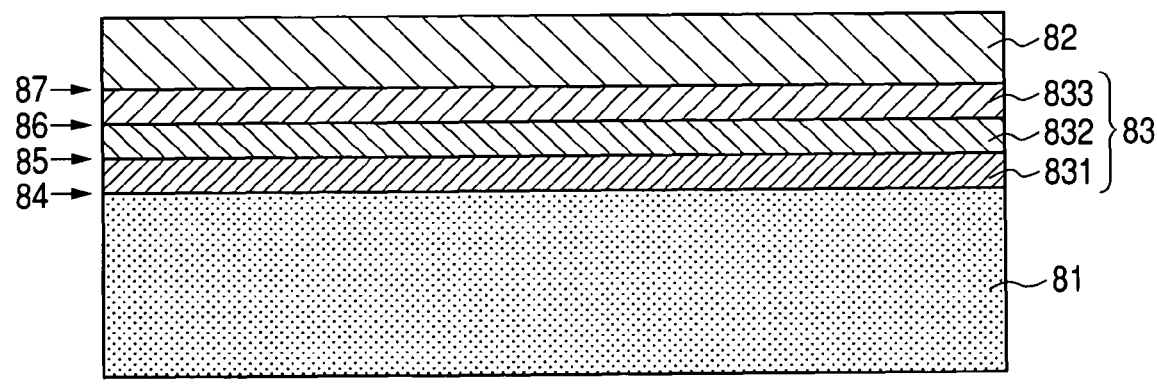
FIG. 8E is a cross-sectional view showing a manufacturing process of a silicon carbide semiconductor substrate according to a second embodiment of the present invention.

Next, in the process shown in FIG. 8E, after the maintenance time to grow the silicon carbide layer 833 elapses, the supply of the monosilane gas, the propane gas, and the nitrogen gas stop, which is maintained at 1500° C. for 30 seconds in the hydrogen stream. Thereafter, the propane gas of 2.4 sccm is supplied to the reactor. Then, the monosilane gas of 6.0 sccm and the nitrogen gas of 1.0 sccm are simultaneously supplied to the reactor. The growth of the silicon carbide epitaxial film starts again by the supply of the monosilane gas. A drift layer 82 having a thickness of about 20 μm is epitaxially grown on the silicon carbide layer 833 by being maintained for 120 minutes under this state.

After the drift layer is formed, the supply of the monosilane gas and the nitrogen gas stops. Next, the supply of the propane gas stops. Subsequently, the RF heating stops and it is cooled down in the hydrogen stream.

After the temperature of the susceptor sufficiently reduces, the supply of hydrogen stops and after the inside of the reactor is exhausted, the substrate is taken out. The donor concentration of the drift layer becomes $5 \times 10^{15}$ cm$^{-3}$.

The silicon carbide semiconductor substrate according to the second embodiment is formed by the above process. An etch pit is formed on the silicon carbide semiconductor substrate by using a potassium hydroxide melting solution and the basal plane dislocation density is obtained as 11 cm$^{-2}$.

As described above, the second embodiment uses a method that does not continuously grow each layer as in the first embodiment but stops the growth once and maintains the growth layer in the hydrogen atmosphere and then grows a next layer. The basal plane dislocation density of the drift layer can be further reduced by using such an intermittent growth method.

Third Embodiment

Figure 3A:
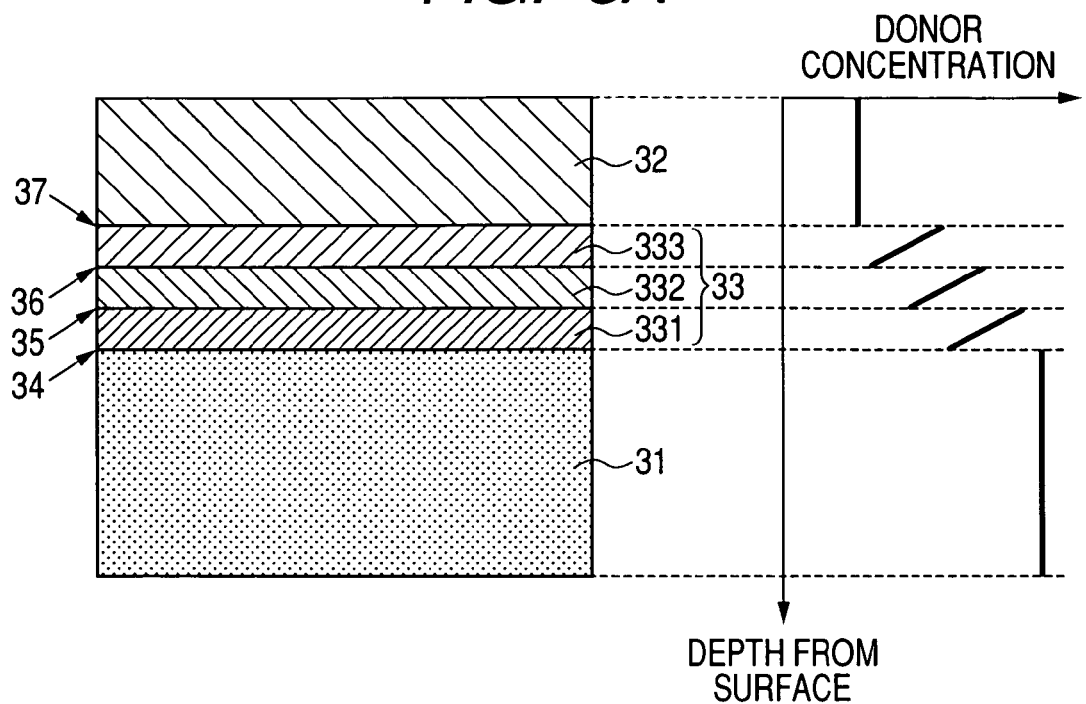
FIG. 3A is a cross-sectional view showing a configuration of a silicon carbide semiconductor substrate according to an embodiment of the present invention and a schematic diagram showing a change in a thickness direction of donor concentration.
Figure 3B:
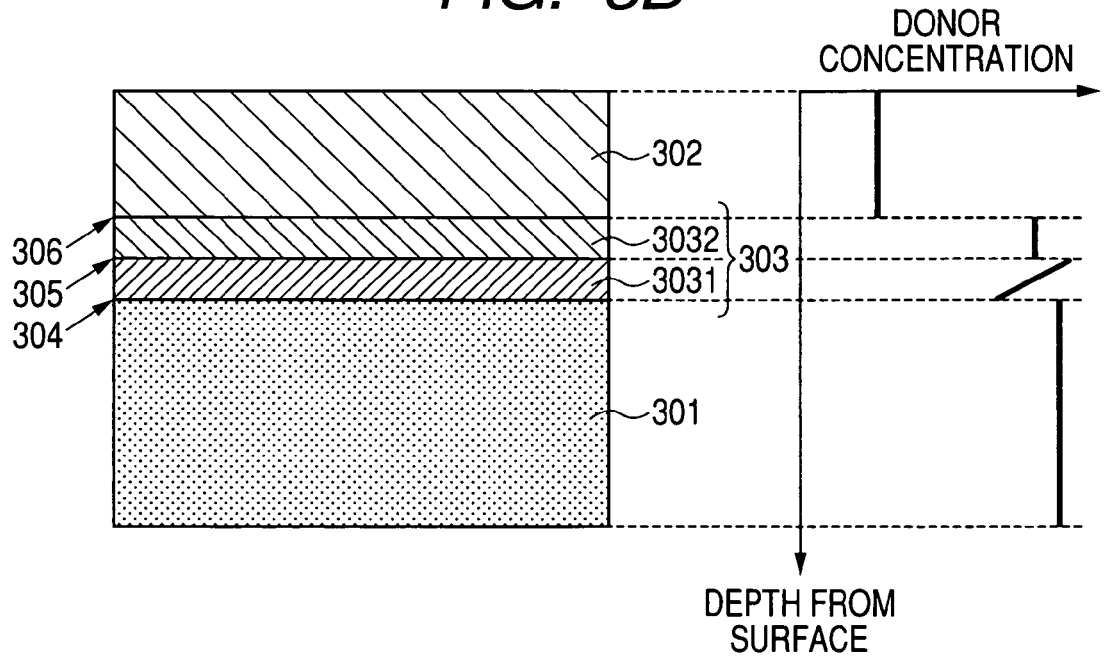
FIG. 3B is a cross-sectional view showing a configuration of a silicon carbide semiconductor substrate according to an embodiment of the present invention and a schematic diagram showing a change in a thickness direction of donor concentration.

As a third embodiment of the present invention, a method of manufacturing a silicon carbide semiconductor substrate having a cross-sectional structure shown in FIG. 3A will be described.

FIGS. 9A to 9E are cross-sectional views showing a manufacturing process of a silicon carbide semiconductor substrate according to the third embodiment.

Figure 9A:
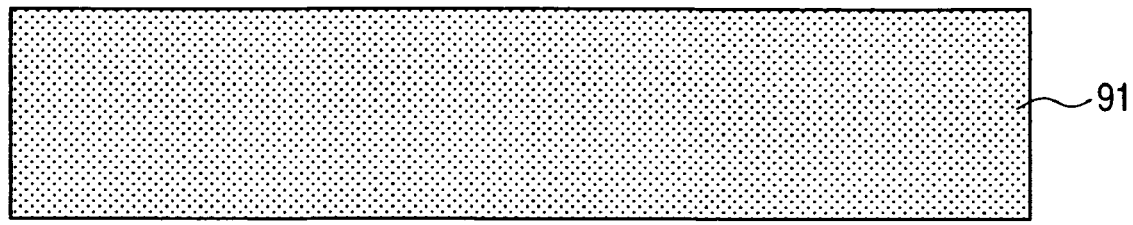
FIG. 9A is a cross-sectional view showing a manufacturing process of a silicon carbide semiconductor substrate according to a third embodiment of the present invention.
Figure 9B:
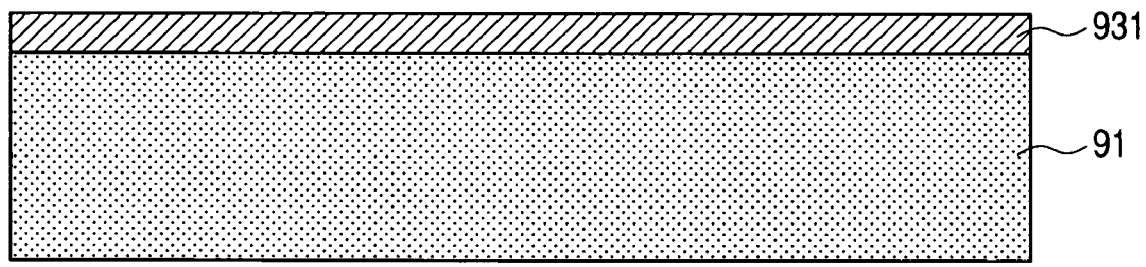
FIG. 9B is a cross-sectional view showing a manufacturing process of a silicon carbide semiconductor substrate according to a third embodiment of the present invention.

First, in the process shown in FIG. 9A, a base substrate 91 including the silicon carbide single crystal wafer is prepared. The silicon carbide single crystal wafer is the n-type 4H—SiC having a diameter of 50 mm and a (0001) Si plane inclined by 8° in a [11-20] direction, wherein the donor concentration is 5×10$^{18}$ cm$^{-3}$. The surface of the Si plane side of the wafer is subjected to the mechanical mirror polishing and then the CMP process. Next, in the process shown in FIG. 9B, the base substrate 91 of FIG. 9A is subjected to an RCA cleaning and then installed in a susceptor of a reactor in a hot-wall CVD system. Next, the reactor is decompressed until a vacuum degree of 3×10$^{-5}$ Pa or less. Subsequently, hydrogen, which is a carrier gas, is supplied at the flow rate of 20 slm by the gas supply system and the pressure of the reactor becomes 13.3 kPa. In the state of maintaining the flow rate of the hydrogen gas, the susceptor is heated by using the RF inductive heating apparatus.

When the susceptor reaches 1400° C., the temperature is maintained for 5 minutes in the hydrogen stream. After five minutes elapse, the temperature of the susceptor increases again and when the temperature reaches 1500° C., it is maintained at the temperature. Thereafter, a propane gas of 0.9 sccm is supplied to the reactor. Then, the monosilane gas of 3.0 sccm and the nitrogen gas of 1.5 sccm are simultaneously supplied to the reactor. The growth of the silicon carbide epitaxial film starts by the supply of the monosilane gas. A silicon carbide layer 931 having a thickness of about 0.5 µm is epitaxially grown on the Si plane of the base substrate 91 by being maintained for 7 minutes under this state. The supply amount of the nitrogen gas is 1.5 sccm when starting to supply it, but uniformly increases with the passage of time and after seven minutes elapses, becomes 20 sccm.

Figure 9C:
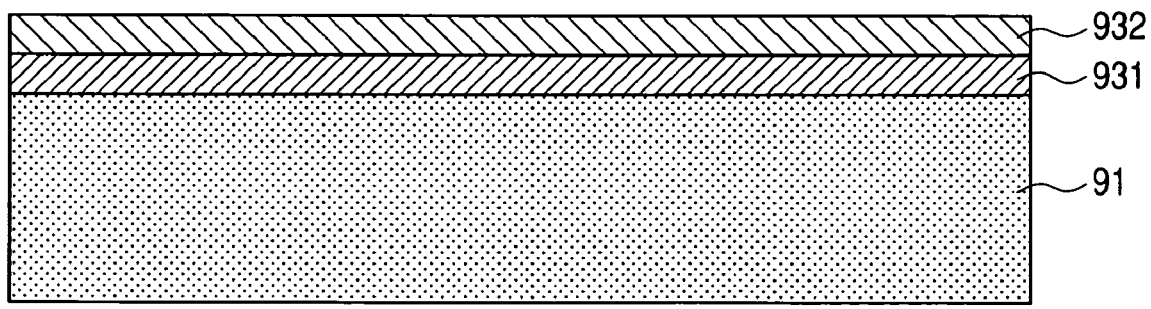
FIG. 9C is a cross-sectional view showing a manufacturing process of a silicon carbide semiconductor substrate according to a third embodiment of the present invention.

Next, in the process shown in FIG. 9C, after the maintenance time to grow the silicon carbide layer 931 elapses, the supply of the monosilane gas, the propane gas, and the nitrogen gas stops, which is maintained at 1500° C. for 30 seconds in the hydrogen stream, such that epitaxial growth stops. Thereafter, the propane gas of 0.9 sccm is supplied to the reactor. Then, the monosilane gas of 3.0 sccm and the nitrogen gas of 0.6 sccm are simultaneously supplied to the reactor. The growth of the silicon carbide epitaxial film starts again by the supply of the monosilane gas. A silicon carbide layer 932 having a thickness of about 0.5 µm is epitaxially grown on the silicon carbide layer 931 by being maintained for 7 minutes under this state. The supply amount of the nitrogen gas is 0.6 sccm when starting to supply it, but uniformly increases with the passage of time and after seven minutes elapses, becomes 8.0 sccm.

Figure 9D:
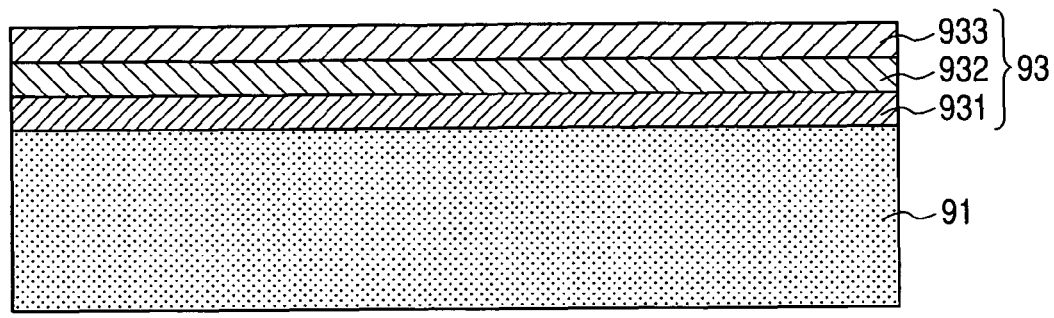
FIG. 9D is a cross-sectional view showing a manufacturing process of a silicon carbide semiconductor substrate according to a third embodiment of the present invention.

Next, in the process shown in FIG. 9D, after the maintenance time to grow the silicon carbide layer 932 elapses, the supply of the monosilane gas, the propane gas, and the nitrogen gas stops, which is maintained at 1500° C. for 30 seconds in the hydrogen stream. Thereafter, the propane gas of 0.9 sccm is supplied to the reactor. Then, the monosilane gas of 3.0 sccm and the nitrogen gas of 0.2 sccm are simultaneously supplied to the reactor. The growth of the silicon carbide epitaxial film starts again by the supply of the monosilane gas. A silicon carbide layer 933 having a thickness of about 0.5 µm is epitaxially grown on the silicon carbide layer 932 by being maintained for 7 minutes under this state. The supply amount of the nitrogen gas is 0.2 sccm when starting to supply it, but uniformly increases with the passage of time and after seven minutes elapses, becomes 3.5 sccm. The silicon carbide layers 931, 932, and 933 configure a dislocation conversion layer 93.

Figure 9E:
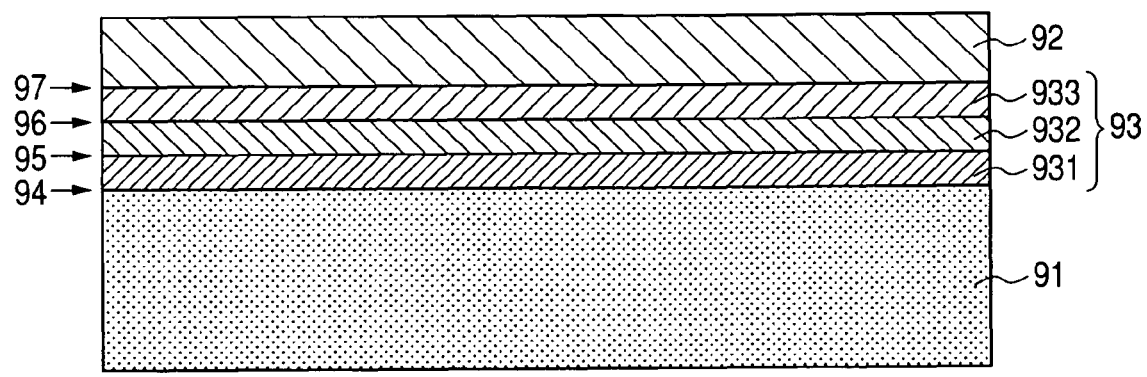
FIG. 9E is a cross-sectional view showing a manufacturing process of a silicon carbide semiconductor substrate according to a third embodiment of the present invention.

Next, in the process shown in FIG. 9E, after the maintenance time to grow the silicon carbide layer 933 elapses, the supply of the monosilane gas, the propane gas, and the nitrogen gas stops, which is maintained at 1500° C. for 30 seconds in the hydrogen stream. Thereafter, the propane gas of 2.4 sccm is supplied to the reactor. Then, the monosilane gas of 6.0 sccm and the nitrogen gas of 1.0 sccm are simultaneously supplied to the reactor. The growth of the silicon carbide epitaxial film starts again by the supply of the monosilane gas. A drift layer 92 having a thickness of about 20 µm is epitaxially grown on the silicon carbide layer 933 by being maintained for 120 minutes under this state.

After the drift layer is formed, the supply of the monosilane gas and the nitrogen gas stops. Next, the supply of the propane gas stops. Subsequently, the RF heating stops and it is cooled down in the hydrogen stream.

After the temperature of the susceptor sufficiently reduces, the supply of hydrogen stops and after the inside of the reactor is exhausted, the substrate is taken out. The donor concentration of the drift layer becomes 5×10$^{15}$ cm$^{-3}$. The silicon carbide semiconductor substrate according to the third embodiment is formed by the above process. An etch pit is formed on the part of the silicon carbide semiconductor substrate by using a potassium hydroxide melting solution and the basal plane dislocation density is obtained as 6 cm$^{-2}$.

A change in a thickness direction of nitrogen concentration of the silicon carbide semiconductor substrate according to the above-mentioned process is measured by a secondary ion mass spectrometry. A schematic diagram of the donor concentration distribution obtained from the analysis results is shown in FIG. 9F. It is considered that the nitrogen concentration is approximately equal to the donor concentration in the silicon carbide at a room temperature. The donor concentration increases as each layer of the silicon carbide layers 931, 932, and 933 configuring the dislocation conversion layer 93 is formed. As a result, the donor concentration differences in the interfaces 94, 95, 96, and 97 of each layer are larger than that in the interfaces 84, 85, 86, and 87 of the second embodiment, respectively.

As described above, in the third embodiment, the number of silicon carbide layers configuring the dislocation conversion layer, that is, the number of interfaces where the conversion of dislocation is generated is equal to the second embodiment, but the donor concentration differences in the interfaces are large, such that the conversion efficiency of the basal plane dislocation in each interface is improved, thereby making it possible to further reduce the basal plane dislocation density of the drift layer.

Fourth Embodiment

Figure 4:
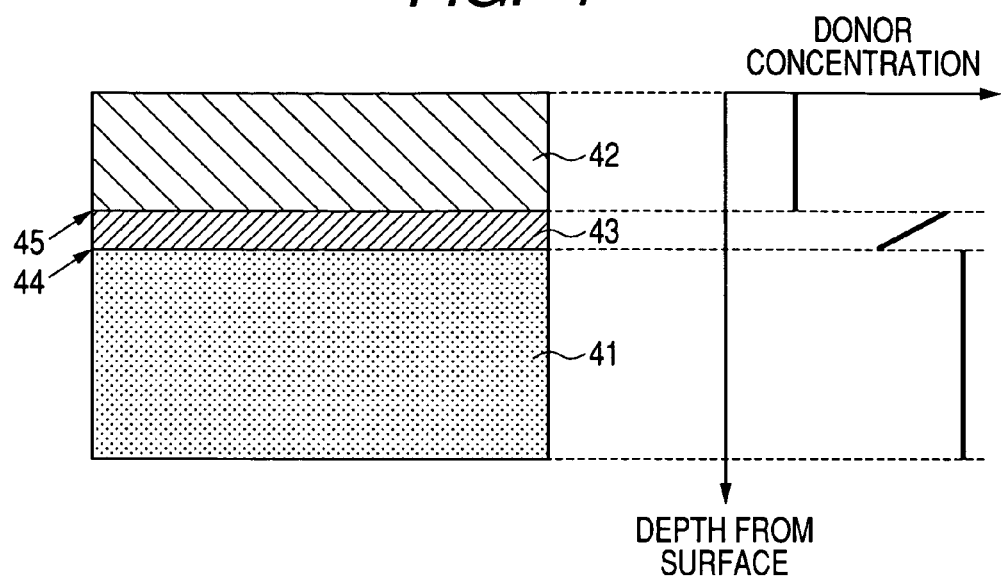
FIG. 4 is a cross-sectional view showing a configuration of a silicon carbide semiconductor substrate according to an embodiment of the present invention and a schematic diagram showing a change in a thickness direction of donor concentration.

As a fourth embodiment of the present invention, a method of manufacturing a silicon carbide semiconductor substrate having a cross-sectional structure shown in FIG. 4 will be described.

Figure 10A:
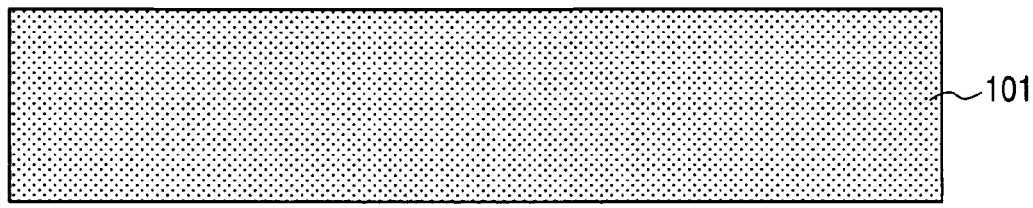
FIG. 10A is a cross-sectional view showing a manufacturing process of a silicon carbide semiconductor substrate according to a fourth embodiment of the present invention.
Figure 10B:
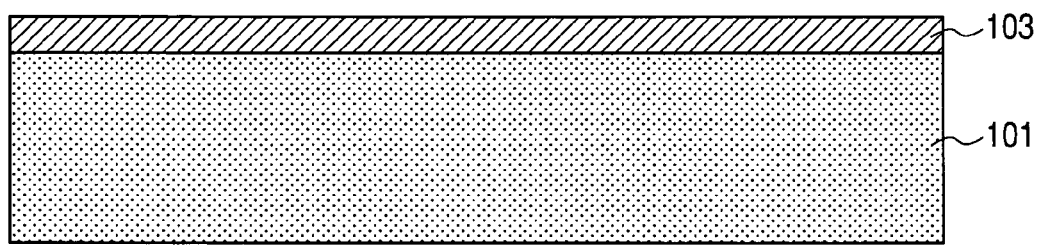
FIG. 10B is a cross-sectional view showing a manufacturing process of a silicon carbide semiconductor substrate according to a fourth embodiment of the present invention.
Figure 10C:
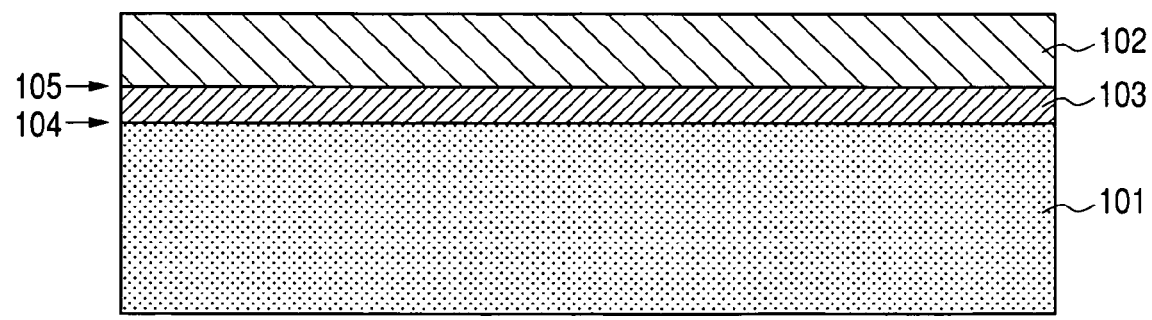
FIG. 10C is a cross-sectional view showing a manufacturing process of a silicon carbide semiconductor substrate according to a fourth embodiment of the present invention.

FIGS. 10A to 10C are cross-sectional views showing a manufacturing process of a silicon carbide semiconductor substrate according to the fourth embodiment. First, in the process shown in FIG. 10A, a base substrate 101 including the silicon carbide single crystal wafer is prepared. The silicon carbide single crystal wafer is the n-type 4H—SiC having a diameter of 50 mm and a (0001) Si plane inclined by 8° in a [11-20] direction, wherein the donor concentration is $5\times10^{18}$ cm$^{-3}$. The surface of the Si plane side of the wafer is subjected to the mechanical mirror polishing and then the CMP process.

Next, in the process shown in FIG. 10B, the base substrate 101 of FIG. 10A is subjected to an RCA cleaning and then installed in a susceptor of a reactor in a hot-wall CVD system. Next, the reactor is decompressed until a vacuum degree of $3\times10^{-5}$ Pa or less. Subsequently, hydrogen, which is a carrier gas, is supplied at the flow rate of 20 slm by the gas supply system and the pressure of the reactor becomes 13.3 kPa. In the state of maintaining the flow rate of the hydrogen gas, the susceptor is heated by using the RF inductive heating apparatus.

When the susceptor reaches 1400° C., the temperature is maintained for 5 minutes in the hydrogen stream. After five minutes elapse, the temperature of the susceptor increases again and when the temperature reaches 1500° C., it is maintained at the temperature. Thereafter, a propane gas of 0.9 sccm is supplied to the reactor. Then, the monosilane gas of 3.0 sccm and the nitrogen gas of 1.5 sccm are simultaneously supplied to the reactor. The growth of the silicon carbide epitaxial film starts by the supply of the monosilane gas. A dislocation conversion layer 103 having a thickness of about 0.5 μm is epitaxially grown on the Si plane of the base substrate 101 by being maintained for 7 minutes under this state. The supply amount of the nitrogen gas is 1.5 sccm when starting to supply it, but uniformly increases with the passage of time and after seven minutes elapses, becomes 20 sccm.

Next, in the process shown in FIG. 10C, after the maintenance time to grow the dislocation conversion layer 103 elapses, the supply of the monosilane gas, the propane gas, and the nitrogen gas stops, which is maintained at 1500° C. for 30 seconds in the hydrogen stream. Thereafter, the propane gas of 2.4 sccm is supplied to the reactor. Then, the monosilane gas of 6.0 sccm and the nitrogen gas of 1.0 sccm are simultaneously supplied to the reactor. The growth of the silicon carbide epitaxial film starts again by the supply of the monosilane gas. A drift layer 102 having a thickness of about 20 μm is epitaxially grown on the dislocation conversion layer 103 by being maintained for 120 minutes under this state.

After the drift layer is formed, the supply of the monosilane gas and the nitrogen gas stops. Next, the supply of the propane gas stops. Subsequently, the RF heating stops and it is cooled down in the hydrogen stream.

After the temperature of the susceptor sufficiently reduces, the supply of hydrogen stops and after the inside of the reactor is exhausted, the substrate is taken out. The donor concentration of the drift layer becomes $5\times10^{15}$ cm$^{-3}$.

The silicon carbide semiconductor substrate according to the fourth embodiment is formed by the above process. An etch pit is formed on the part of the silicon carbide semiconductor substrate by using a potassium hydroxide melting solution and the basal plane dislocation density is obtained as 45 cm$^{-2}$.

Figure 10D:
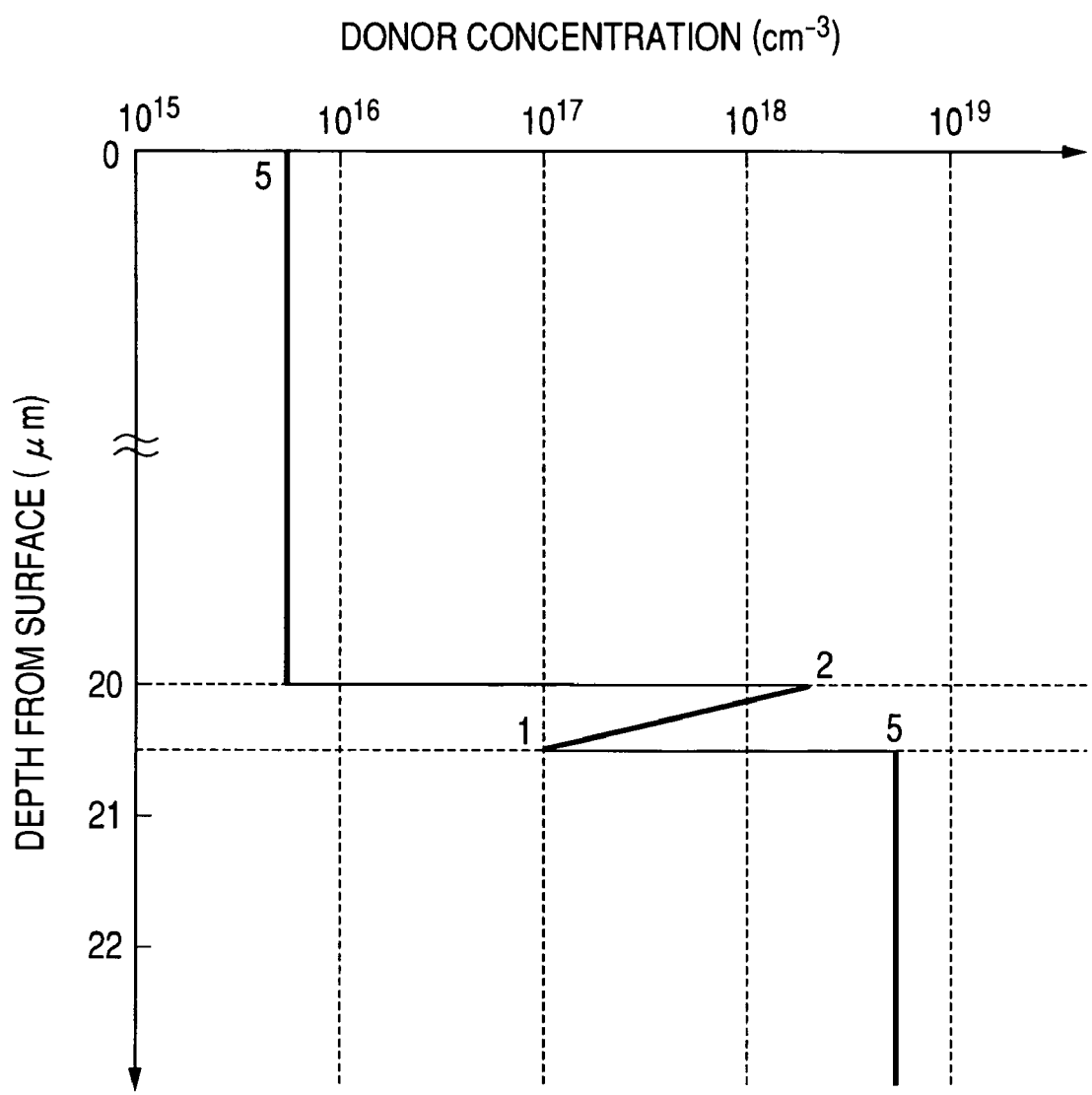
FIG. 10D is a schematic diagram showing a change in a thickness direction of donor concentration of a silicon carbide semiconductor substrate according to a fourth embodiment of the present invention.

A change in a thickness direction of nitrogen concentration of the silicon carbide semiconductor substrate according to the above-mentioned process is measured by a secondary ion mass spectrometry. A schematic diagram of the donor concentration distribution obtained from the results is shown in FIG. 10D. It is considered that the nitrogen concentration is approximately equal to the donor concentration in the silicon carbide at a room temperature. The donor concentration increases as the dislocation conversion layer 103 is formed. As a result, the donor concentration differences in the interfaces 104 and 105 of each layer are larger than that in the interfaces 74 and 75 of the second conventional example of the first embodiment, respectively.

As described above, in the fourth embodiment, the number of silicon carbide layers configuring the dislocation conversion layer, that is, the number of interfaces where the conversion of dislocation is generated is equal to the second conventional example, but the donor concentration differences in the interfaces are large, such that the conversion efficiency of the basal plane dislocation in each interface is improved, thereby making it possible to further reduce the basal plane dislocation density of the drift layer.

What is claimed is:

1. A silicon carbide semiconductor substrate, comprising:
   a base substrate including a silicon carbide single crystal; and
   a silicon carbide epitaxial growth layer installed on one surface of the base substrate,
   wherein:
   the silicon carbide epitaxial growth layer includes a first semiconductor layer having a first donor concentration distribution and a second semiconductor layer having a second donor concentration distribution installed between the first semiconductor layer and the base substrate;
   the donor concentration of the second semiconductor layer having the second donor concentration distribution is higher than donor concentration of the first semiconductor layer at a first interface where the second semiconductor layer is in contact with the first semiconductor layer and lower than a donor concentration of the base substrate at a second interface where the second semiconductor layer is in contact with the base substrate and a donor concentration from the first interface to the second interface monotonically reduces; and
   the donor concentration of the first semiconductor layer at the first interface is lower than that of the base substrate at the second interface.

2. The silicon carbide semiconductor substrate according to claim 1, wherein the surface forming the epitaxial growth layer on the base substrate is maximally inclined by 15° from a {0001} crystal plane, the base substrate is an n-type, and the donor concentration is $1\times10^{18}$ cm$^{-3}$ or more.

3. The silicon carbide semiconductor substrate, comprising:
   a base substrate including a silicon carbide single crystal; and
   a silicon carbide epitaxial growth layer installed on one surface of the base substrate,
   wherein: the silicon carbide epitaxial growth layer includes a first semiconductor layer and a second semiconductor layer installed between the first semiconductor layer and the base substrate and, the second semiconductor layer being sequentially stacked with n (n is an integer of 2 or more) layers;

the second semiconductor layer is sequentially stacked with i (i is an integer from 2 to n) layers having i donor concentration distributions from the first semiconductor layer to the base substrate;

the i donor concentration distributions monotonically reduce from an $i^{th}$ interface where an $i-1^{th}$ layer be in contact with the $i^{th}$ layer to an $i+1^{th}$ interface where the $i^{th}$ layer be in contact with the $i+1^{th}$ layer;

the donor concentration of the $i^{th}$ layer at the $i^{th}$ interface is lower than that of the $i+1^{th}$ layer at the $i+1^{th}$ interface; and the donor concentration of the first semiconductor layer at the interface where the first semiconductor layer be in contact with the second layer is set to be lower than that of the base substrate at the interface where the base substrate be in contact with the $n^{th}$ layer.

4. The silicon carbide semiconductor substrate according to claim 3, wherein the surface forming the epitaxial growth layer on the base substrate is maximally inclined by 15° from a {0001} crystal plane, the base substrate is an n-type, and the donor concentration is $1 \times 10^{18}$ cm$^{-3}$ or more.

5. The silicon carbide semiconductor substrate according to claim 3, wherein the donor concentration distributions are uniform from $i^{th}$ interface to the $i+1^{th}$ interface.

6. The silicon carbide semiconductor substrate according to claim 3, wherein at least one of the i donor concentration distributions is uniform from $i^{th}$ interface to the $i+1^{th}$ interface and other donor concentration distributions is a monotonically reduced concentration distribution.

* * * * *